(12) United States Patent
Co et al.

(10) Patent No.: US 6,357,023 B1
(45) Date of Patent: *Mar. 12, 2002

(54) CONNECTOR ASSEMBLY FOR TESTING MEMORY MODULES FROM THE SOLDER-SIDE OF A PC MOTHERBOARD WITH FORCED HOT AIR

(75) Inventors: Ramon S. Co, Trabuco Canyon; Steve Si-Yu Chen, San Jose; Fred Yen Kong, Irvine; Thang Nguyen, Santa Ana, all of CA (US)

(73) Assignee: Kingston Technology Co., Fountain Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/702,017

(22) Filed: Oct. 30, 2000

Related U.S. Application Data

(63) Continuation-in-part of application No. 09/056,973, filed on Apr. 8, 1998, now Pat. No. 6,178,526.

(51) Int. Cl.[7] .......................... H02H 3/05; H03K 19/003
(52) U.S. Cl. ........................................ 714/42; 714/718
(58) Field of Search .............................. 714/42, 29, 54, 714/718, 767; 711/115, 170, 173; 710/102, 103; 324/158.1, 158; 439/79

(56) References Cited

U.S. PATENT DOCUMENTS

| | | | | |
|---|---|---|---|---|
| 4,788,496 A | | 11/1988 | Maelzer et al. ............... 324/158 |
| 4,992,850 A | * | 2/1991 | Corbett et al. ............... 257/203 |
| 5,184,068 A | * | 2/1993 | Twigg et al. ................. 324/755 |
| 5,224,023 A | * | 6/1993 | Smith et al. .................. 361/784 |
| 5,228,039 A | * | 7/1993 | Knoke et al. .................... 714/28 |
| 5,301,343 A | * | 4/1994 | Alvarez ....................... 711/170 |
| 5,329,226 A | | 7/1994 | Monnet et al. ........... 324/158.1 |
| 5,357,519 A | * | 10/1994 | Martin et al. ................... 714/25 |
| 5,423,028 A | * | 6/1995 | Schieve et al. ................. 714/42 |
| 5,450,576 A | * | 9/1995 | Kennedy ......................... 713/2 |
| 5,477,161 A | | 12/1995 | Kardos et al. ............... 324/755 |
| 5,519,832 A | * | 5/1996 | Warchol ....................... 714/46 |
| 5,533,194 A | * | 7/1996 | Albin et al. ................... 714/42 |
| 5,559,445 A | | 9/1996 | Eaddy et al. ............... 324/755 |
| 5,581,712 A | * | 12/1996 | Herrman ..................... 710/103 |
| 5,611,436 A | * | 3/1997 | Ashby ......................... 209/573 |
| 5,655,083 A | * | 8/1997 | Bagley ......................... 714/23 |
| 5,655,106 A | * | 8/1997 | Smith ......................... 395/500 |
| 5,666,049 A | | 9/1997 | Yamada et al. .......... 324/158.1 |
| 5,704,489 A | * | 1/1998 | Smith ........................... 209/2 |
| 5,706,300 A | * | 1/1998 | Wedel ......................... 714/724 |
| 5,709,568 A | | 1/1998 | Pan et al. ................. 439/541.5 |
| 5,711,679 A | | 1/1998 | Spickler et al. ............... 439/79 |
| 5,754,057 A | | 5/1998 | Hama et al. ................. 324/754 |
| 5,852,617 A | * | 12/1998 | Mote, Jr. ..................... 714/726 |

(List continued on next page.)

Primary Examiner—Dieu-Minh Le
(74) Attorney, Agent, or Firm—Stuart T. Auvineu

(57) ABSTRACT

Memory modules are tested using a test assembly with a personal computer (PC) motherboard. The motherboard is mounted upside-down with its solder-side up to a metal plate using standoffs. A memory-module socket on the motherboard is removed. An opening is made in the metal plate above the removed socket. A well is attached to the metal plate at the opening. The well supports a test adaptor board below the metal plate so that the test adaptor board has a closer spacing to the motherboard than does the metal plate. The test adaptor board has a test socket that receives a module being tested. Pins from the test adaptor board are plugged into the holes of the removed socket on the motherboard, but mounted on the reverse, solder side of the motherboard rather than the component side. The cables, components, and expansion boards of the motherboards are hidden below the metal plate and motherboard, and can be cooled without cooling the memory module in the test socket. A top plate or air guide can be added above the metal plate to blow hot air on the memory module being tested in the test socket, while the cooling air is blown on the motherboard.

21 Claims, 10 Drawing Sheets

U.S. PATENT DOCUMENTS

| | | | | |
|---|---|---|---|---|
| 5,862,320 A | * | 1/1999 | Nelsen et al. | 395/183.18 |
| 5,986,447 A | | 11/1999 | Hanners et al. | 324/158.1 |
| 6,046,421 A | * | 4/2000 | Ho | 209/573 |
| 6,089,878 A | | 7/2000 | Meng | 439/79 |
| 6,092,146 A | * | 7/2000 | Dell et al. | 711/5 |
| 6,093,038 A | | 7/2000 | Chen et al. | 439/131 |
| 6,122,756 A | * | 9/2000 | Baxter et al. | 714/30 |
| 6,175,774 B1 | * | 1/2001 | Frank et al. | 700/79 |

* cited by examiner

US 6,357,023 B1

CONNECTOR ASSEMBLY FOR TESTING MEMORY MODULES FROM THE SOLDER-SIDE OF A PC MOTHERBOARD WITH FORCED HOT AIR

RELATED APPLICATION

This application is a continuation-in-part of the application for "Testing Memory Modules with a PC Motherboard Attached to a Memory-Module Handler by a Solder-Side Adaptor Board", U.S. Ser. No. 09/056,973, filed Apr. 8, 1998 now U.S. Pat. No. 6,178,526.

FIELD OF THE INVENTION

This invention relates to electronic test systems, and more particularly to test-adapter boards for testing memory modules including SIMMs and DIMMs.

BACKGROUND OF THE INVENTION

Electronic systems such as Personal computers (PCs) often use dynamic-random-access memory (DRAM) memory chips mounted on small, removable memory modules. The original single-inline memory modules (SIMMs) have been replaced with dual-inline memory modules (DIMMs), and 184-pin RIMMs (Rambus inline memory modules) and 184-pin DDR (double data rate) DIMMs.

The memory-module industry is very cost sensitive. Testing costs are significant, especially for higher-density modules. Specialized, high-speed electronic test equipment is expensive, and the greater number of memory cells on high-speed memory modules increases the time spent on the tester, increasing costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test.

More recently, handlers have been made for memory modules. U.S. Pat. No. 5,704,489 by Smith, describes in detail a "SIMM/DIMM Board Handler" such as those in use today. FIG. 1 shows a SIMM handler connected to a high-speed electronic tester. Memory modules 18 to be tested are loaded into the top of handler 10 in the input stack. Memory modules 18 drop down, one-by-one, into testing area. Module-under test MUT 20 is next to be tested. Arm 26 pushes MUT 20 laterally until it makes contact with contactor pins 16 that clamp down on "leadless" connector pads formed on the substrate of MUT 20.

Contactor pins 16 are also connected to test head 14, which makes connection to tester 12. Tester 12 executes parametric and functional test programs that determine when MUT 20 falls within specified A.C. and D.C. parameters, and whether all memory bit locations can have both a zero and a one written and read back.

Tester 12 can cost from ten-thousand to millions of dollars. Cost can be reduced if a less-expensive tester replaces tester 12. Since most memory modules are intended for installation on PCs, some manufacturers test memory modules simply by plugging them into SIMM or DIMM sockets on PC motherboards. A test program is then executed on the PC, testing the inserted module. Since PCs cost only about a thousand dollars, tester 12 and handler 10 of FIG. 1 are replaced by a low-cost PC. Equipment costs are thus reduced by a factor of a hundred.

FIG. 2 shows a PC motherboard being used to manually test memory modules. Substrate 30 is a motherboard. Components 42, 44, mounted on the top side of substrate 30, include ICs such as a microprocessor, logic chips, buffers, and peripheral controllers. Sockets for expansion cards 46 are also mounted onto the top or component side of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

While using PC motherboards for testing memory modules greatly reduces equipment costs, labor costs are increased. Memory modules must be inserted and removed manually. Manual insertion and removal of memory modules is slow and labor-intensive.

The parent application teaches that the component side of the PC motherboard is too crowded for attaching a SIMM/DIMM handler. The inventors realized that the back or solder-side of the PC motherboard is less crowded and provides unobstructed access. The PC motherboard is modified to provide reverse attachment of the handler to the solder-side of the PC motherboard using a handler adapter board. The SIMM socket on the component side of the PC motherboard is removed, and the handler adapter board is plugged from the backside into the holes on the PC motherboard for the SIMM socket.

Handler Mounted Close to PC Motherboard—FIG. 3

FIG. 3 shows a SIMM/DIMM handler mounted close to the backside of the PC motherboard using the handler adaptor board. Handler 10 is not drawn to scale since it is several times larger than a PC motherboard. However, FIG. 3 does highlight how handler 10 can fit close to the removed SIMM socket. Such close mounting reduces loading and facilitates high-speed testing.

Contactor pins 16 within handler 10 clamp down onto leadless pads on the edge of module-under-test MUT 20 when arm 26 pushes MUT 20 into place for testing. Contactor pins 16 are electrically connected to connectors on the backside of handler 10. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be plugged into female pins 57 that are soldered onto solder-side 34 of the PC motherboard. Female pins 57 have extensions that fit into the through-holes exposed by removal of the SIMM socket, but also have cup-like receptacles for receiving adaptor pins 52. Using female pins 57 allows handler adaptor board 50 to be easily removed from substrate 30.

Once MUT 20 has been tested by a test program running on the PC motherboard, MUT 20 is sorted and drops down into either good bin 22 or bad bin 24. Sorting is in response to a pass/fail signal from the test program running on the PC motherboard.

Handler adaptor board 50 provides electrical connection from the module-under-test (MUT) in handler 10 to the removed SIMM socket on the PC motherboard. Handler adaptor board 50 provides a slight spacing or offset from the solder-side 34 surface of substrate 30, allowing handler 10 to be plugged directly into connectors 54 on handler adaptor board 50. Since the offset of adaptor board 50 is slight, the length of electrical connections to the handler is short, minimizing added loading on the PC's memory bus. The relatively flat surface of solder-side 34 allows close mounting of the SIMM/DIMM handler to the PC motherboard.

Improved Test Adaptor Boards Desirable

While the invention described in the parent application has been quite effective, further improvements are desired. The inventors have determined that the handler can be replaced with robotic technology or even with manual insertion. Several improvements to the test adaptor board have been implemented or are contemplated. For example, mechanical stability was improved by adding various metal standoffs between the test adaptor board, metal chassis, and motherboard. These metal standoffs have been in use for more than a year. Improved test sockets are also available that use surface-mount technology rather than pins that fit in through-holes. It is desired to modify the test adaptor board to use such surface-mounted test sockets.

Testing of higher-speed memory can be further improved if the spacing of the test adaptor board to the motherboard is reduced even further. Unfortunately, the metal standoff can limit the minimum spacing. Mounting posts and connecting pins of the peripheral connectors (such as PCI connectors, keyboard/mouse connector, USB connector, audio connector, etc.) on the component side of the motherboard typically protrude beyond the solder-side of the motherboard and can also limit the minimum spacing. While still using the metal standoff to provide mechanical stability, the inventors desire to improve the test adaptor board to reduce spacing, thereby reducing loading of the motherboard's memory bus. This increases test speeds, allowing higher-speed memory modules to be tested.

High Temperature Testing Desirable but Motherboard Fails First

Sometimes environmental testing is desirable. For example, the memory modules can be heated to a higher temperature to test operation under worst-case temperature conditions. Reliability of the tested memory modules is improved with such elevated-temperature testing. Unfortunately, simply heating the test system also heats the motherboard and its many components. Failures can occur on the motherboard before the memory-module under test fails. Such motherboard failures reduce the possible temperatures that the memory modules can be tested at. It would be desirable to heat only the memory modules being tested, while not heating or even cooling the motherboard and its components. Then failures that occurred are likely to be due to the memory module itself and not the motherboard.

DETAILED DESCRIPTION

The present invention relates to an improvement in memory-module test-adapter boards. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that mounting the motherboards upside-down allows a handler or robotic arm free access to the adaptor boards that are mounted on the solder side of the motherboards. The test adaptor board can be modified and improved in a variety of ways, such as improving mechanical stability with stiffeners such as a metal plate, and a metal standoff to the motherboard. The inventors further realize that the metal plate mounted to the test adaptor board may be provided with a well or depression to reduce the spacing of the test socket to the motherboard. Such reduced spacing improves test speed since signal capacitances and resistances are reduced.

Figure 1:
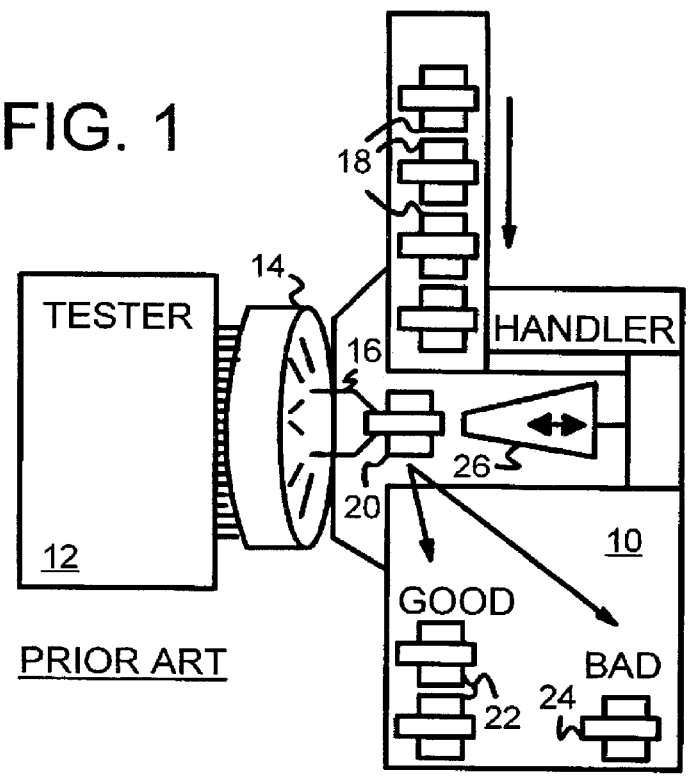
FIG. 1 shows a SIMM handler connected to a high-speed electronic tester.
Figure 2:
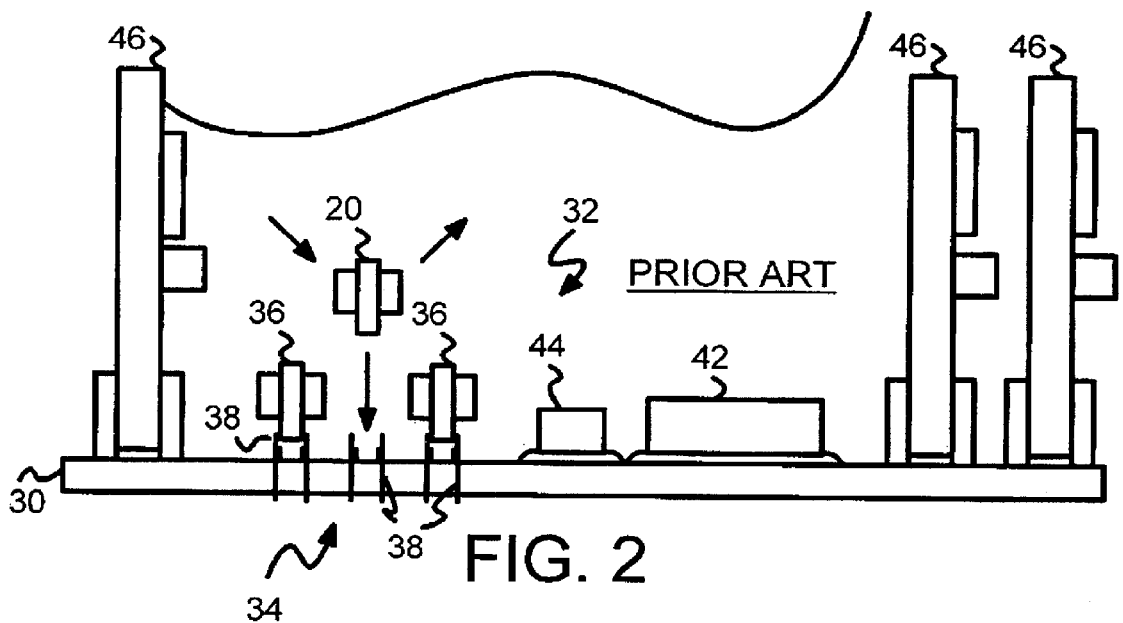
FIG. 2 shows a PC motherboard being used to manually test memory modules.
Figure 3:
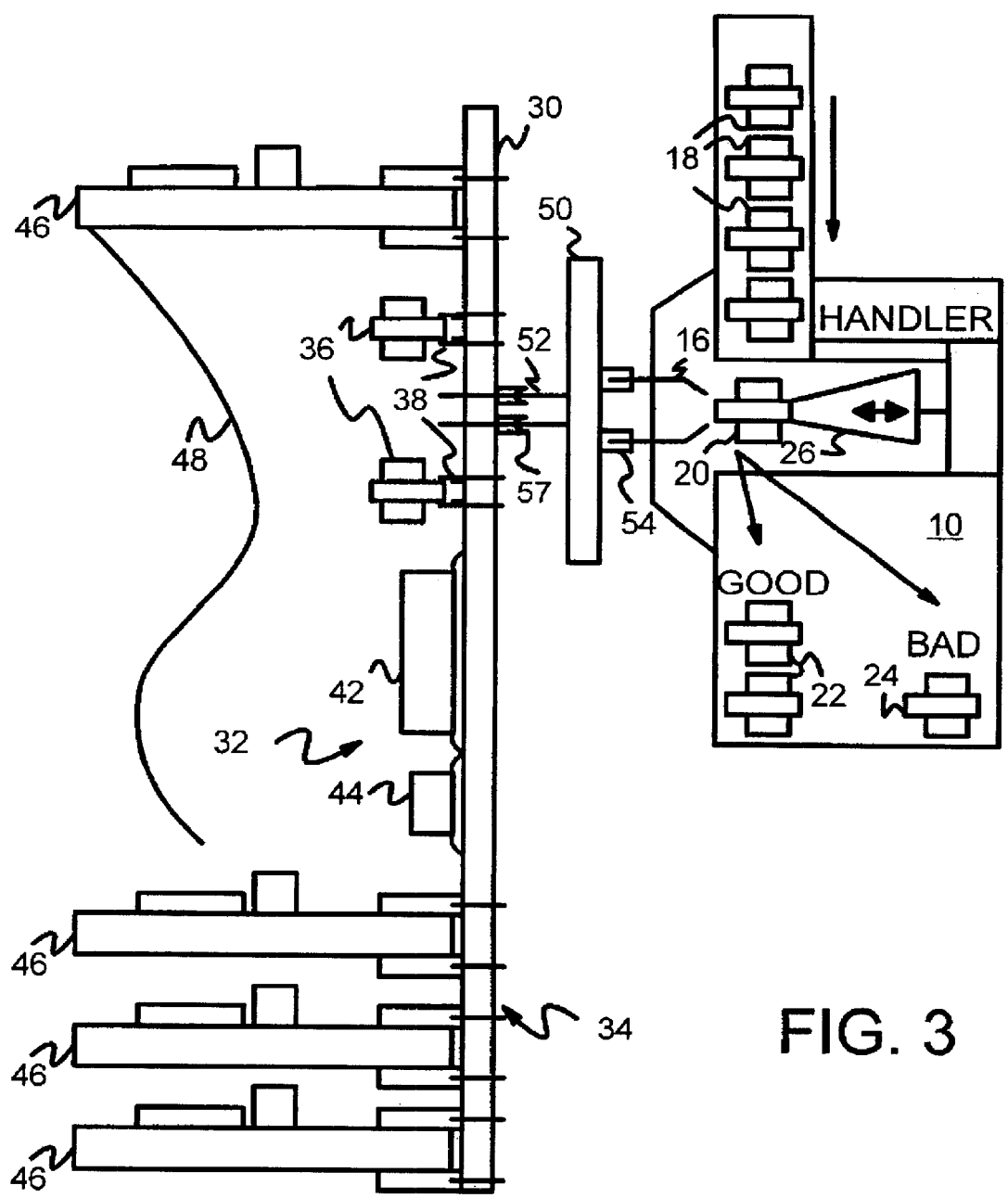
FIG. 3 shows a SIMM/DIMM handler mounted close to the backside of the PC motherboard using the handler adaptor board.
Figure 4:
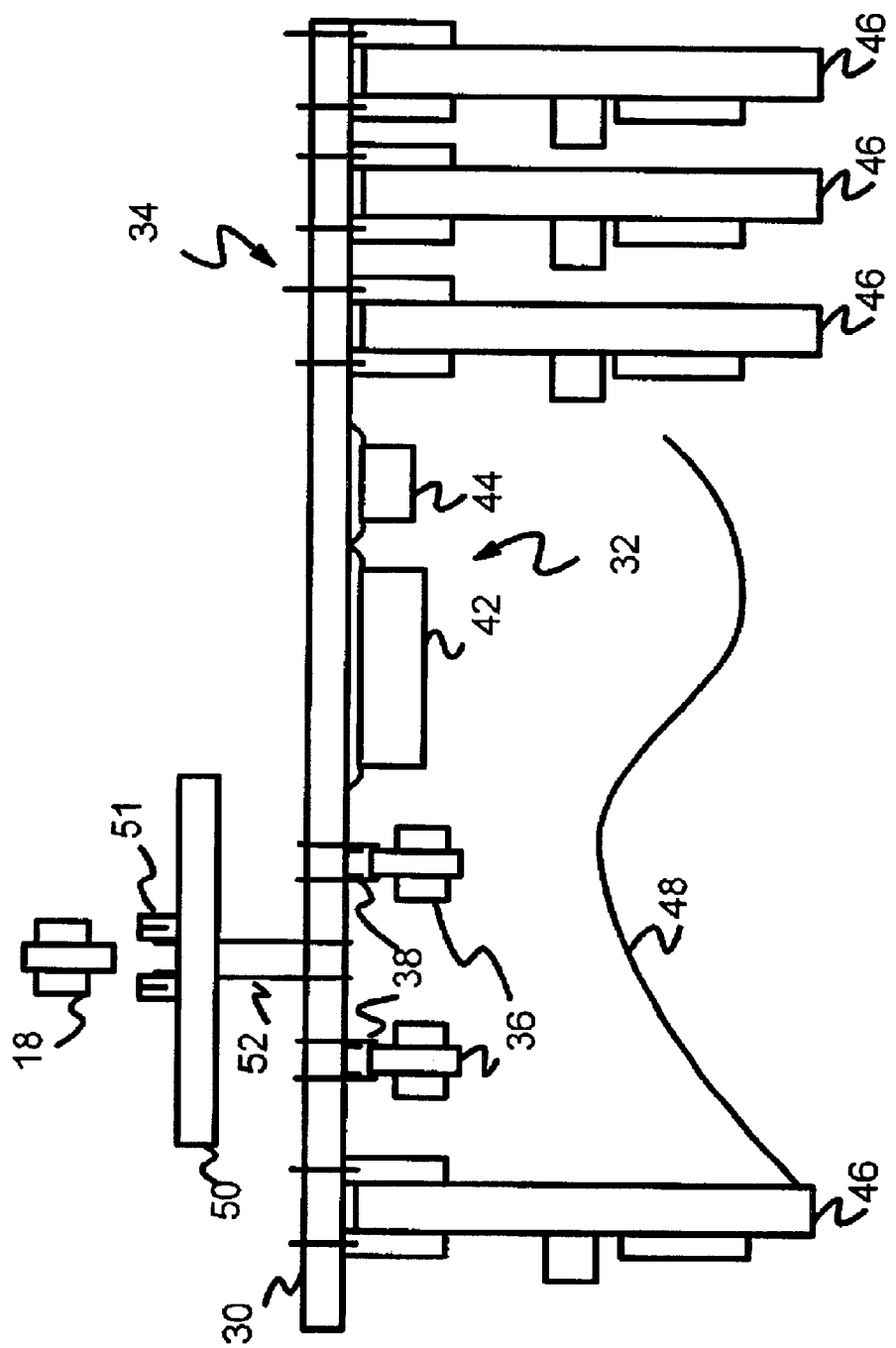
FIG. 4 illustrates an adapter board with a SIMM/DIMM socket mounted onto the solder-side of a PC motherboard using the original holes for a SIMM or DIMM socket.

Adaptor Board Reverse-Mounted to PC Motherboard—FIG. 4

FIG. 4 illustrates an adapter board with a SIMM/DIMM socket mounted onto the solder-side of a PC motherboard using the original holes for a SIMM or DIMM socket. Substrate 30 of the PC motherboard is a conventional multi-layer epoxy-fiberglass circuit board. Components 42, 44 are mounted on component-side 32 of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 obstruct access to memory modules 36. A robotic arm would be unable to insert and remove memory modules from sockets 38 on the component side of substrate 30 due to the obstruction of cables 48 and expansion cards 46.

Test adapter board 50 is a small epoxy-glass circuit board designed to allow an automated handler, a person, or a robotic arm easy access to SIMM/DIMM test socket 51 that is mounted on adaptor board 50. Test socket 51 on one surface of handler adapter board 50 mates with connectors on SIMM/DIMM memory module 18, the module-under test. The other surface of adaptor board 50 has adapter pins 52 protruding through. These adaptor pins are soldered into through-holes in adaptor board 50. Adapter pins 52 are arranged to have the same arrangement and spacing as the substrate-mounting pins for SIMM sockets 38.

SIMM Socket Removed on Front-Side

One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32. Adapter pins 52 are then be soldered to substrate 30.

Test adaptor board 50 provides electrical connection from the module-under-test (MUT) in the SIMM/DIMM test socket 51 to the leads for the removed SIMM socket on the PC motherboard. Test adaptor board 50 provides a slight spacing or offset from the solder-side 34 surface of substrate 30, allowing a robotic arm to easily reach test socket 51 and plug memory module 18 under test directly into test socket 51 on adaptor board 50. Since the offset of adaptor board 50 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 allows close mounting of SIMM/DIMM test socket 51 to the PC motherboard.

New Surface-Mount Test Socket—FIG. 5

Figure 5A:
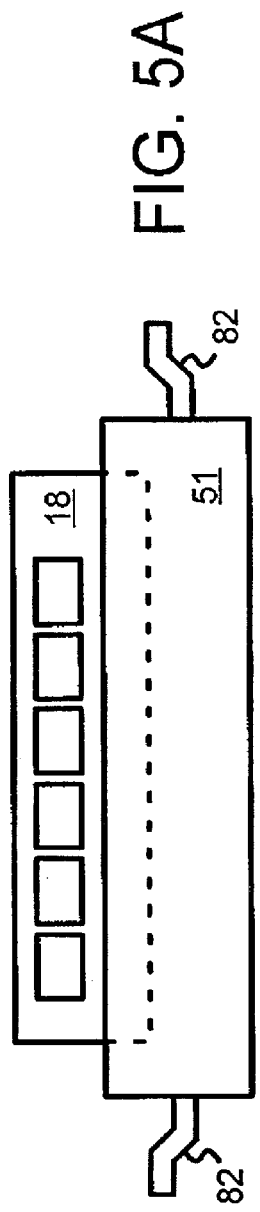
FIGS. 5A, B, C show a surface-mount test socket for testing memory modules.

FIGS. 5A, B, C show a surface-mount test socket for testing memory modules. Such a test socket 51 has recently become commercially available. FIG. 5A is a side view, showing memory module 18 inserted into a slot on the top of test socket 51. Ejectors 82 allow memory module 18 to be ejected from the slot in test socket 51 with little or no wear to the test socket, and with a low or zero insertion force. Ejector 82 is depressed to release memory module 18.

Figure 5B:
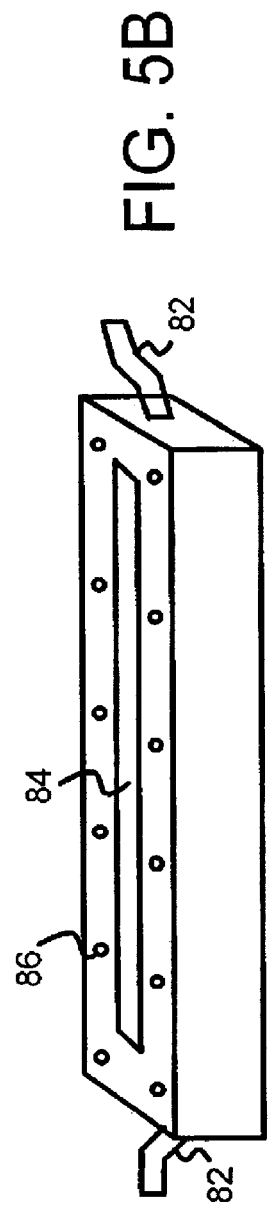
Figure 5C:
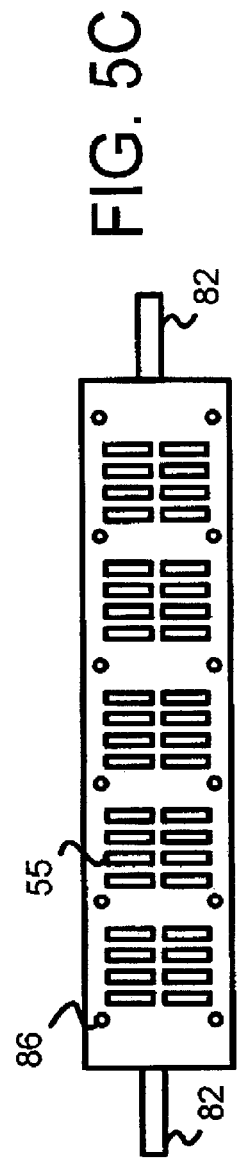

FIG. 5B shows the top of test socket 51 in more detail with the memory module removed. Slot 84 is sized to hold the metal pads of memory module 18. Bolt holes 86 are for long bolts that fit in holes 86 through the housing of test socket 51, allowing test socket 51 to be tightly mounted to a circuit board. FIG. 5C shows the bottom of test socket 51, with bolt holes 86. Bolts (not shown) through bolt holes 86 protrude out the bottom and into or through the circuit board substrate that test socket 51 is mounted to.

Surface pads 55 are relatively flat metal pads or relatively flat metal leads for surface-mounting test socket 51. When test socket 51 is tightly bolted to a substrate, surface pads 55 make physical contact with matching pads on the circuit-board substrate. Electrical contact is made without requiring solder. This allows test socket 51 to be easily replaced once it wears out after many module insertions, or when a different size socket is desired. Test socket 51 contains internal wiring to connect power, ground, address, data and control signals from memory module 18 to surface pads 55.

Figure 6:
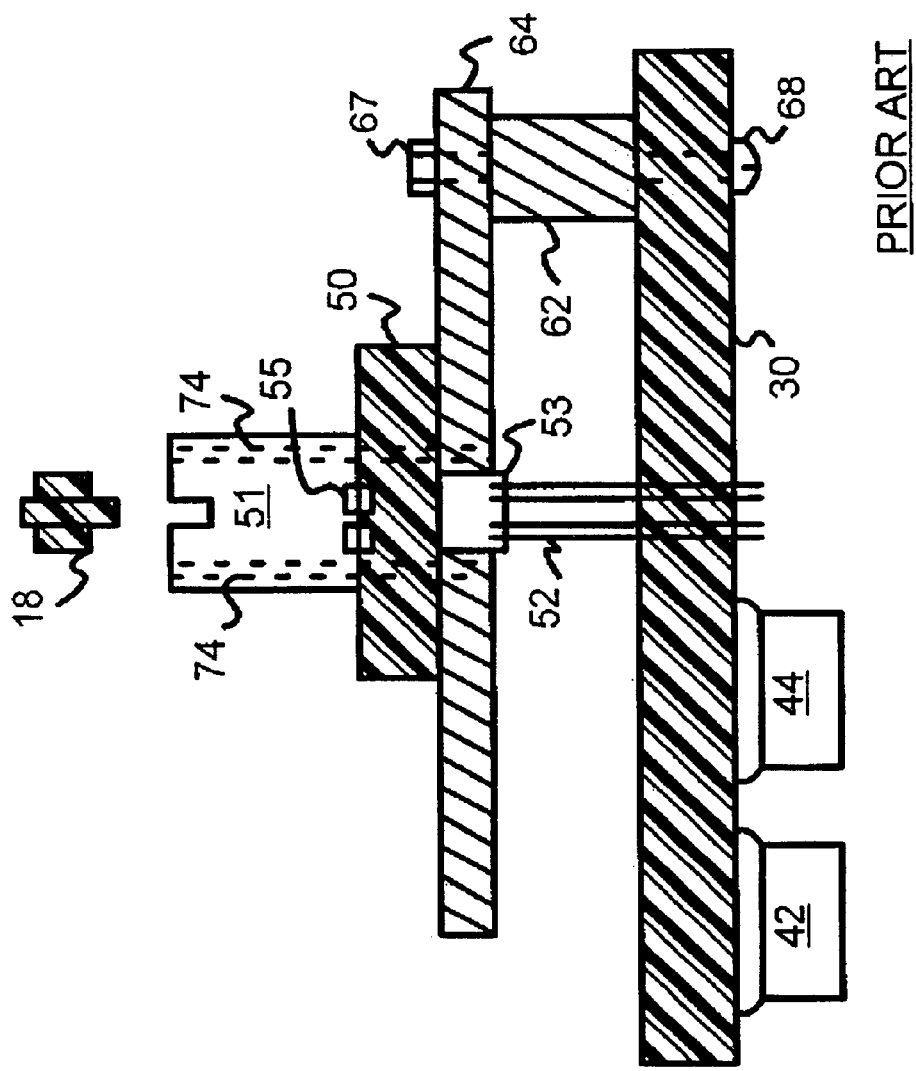
FIG. 6 is a cross-section of a planar metal plate with a test-adaptor-board mounted to a motherboard.

Planar Test-Adaptor Board—FIG. 6

FIG. 6 is a cross-section of a planar metal plate with a test-adaptor-board mounted to a motherboard. Such a planar test adaptor board has been co-developed by a connector/socket vendor for use with Applicant's parent invention. FIG. 6 is not part of the claimed invention of the present application and is thus labeled prior art, even though it depends on ideas disclosed in the parent application.

Memory module 18 is the module to be tested and is inserted into test socket 51 by a robotic arm or other automatic device, or is manually inserted. Test socket 51 is a production-quality test socket requiring a low or zero insertion force and is able to accept many insertions, such as 100,000 or more insertions before the socket fails.

Test socket 51 uses surface-mount technology in this embodiment, although traditional pins or other technologies such as ball-grid arrays could be substituted. The metal leads or pads on the edge connector of memory module 18 make contact with mating pads in the slot on top of test socket 51. Test socket 51 contains internal wiring to connect the power, ground, address, data, and control signals from memory module 18 to surface pads 55 on the bottom of test socket 51. Surface pads 55 make electrical connections with matching pads on the top surface of the substrate of test adaptor board 50. This substrate is typically epoxy-glass or fiberglass, usually with multiple metal layers for wiring, such as with a typical printed-circuit board (PCB).

The matching pads on the top of substrate for test adaptor board 50 are connected by the wiring layers and vias of test adaptor board 50 to connector 53 mounted to the bottom of test adaptor board 50. Connector 53 accepts pins 52. Pins 52 are soldered into holes in motherboard substrate 30. These holes are where a memory-module socket was removed from the front or component-side surface of motherboard substrate 30. Components 42, 44 and many other components (not shown) are mounted to the component side of motherboard substrate 30. Thus electrical connection is made with the motherboard's DRAM memory bus to memory module 18 inserted into test socket 51.

Metal plate 64 rigidly supports test adaptor board 50A metal chassis could also provide this support. Metal plate 64 is held to motherboard substrate 30 by standoff 62. Motherboards are often mounted to a metal chassis such as a PC enclosure by such standoffs, which act as thick washers. Standoff 62 is a metal cylinder that has bolt 68 passing through its center. Bolt 68 passes through a hole in motherboard substrate 30, through standoff 62, and metal plate 64, and is held in place by nut 67. The hole through metal plate 64 may also be threaded, eliminating the need for nut 67.

Test adaptor board 50 is mounted to metal plate 64 by screws or bolts 74. Bolts 74 pass through holes in test socket 51, and holes in the substrate of test adaptor board 50 and metal plate 64. The holes in metal plate 64 can be threaded, or nuts can be used. Bolts 74 rigidly clamp test socket 51 to test adaptor board 50 and also clamp test adaptor board 50 to metal plate 64. The pressure exerted by bolts 74 is sufficient to press surface pads 55 to mating metal pads on the top surface of test adaptor board 50 so that good electrical contact is made. A malleable metal can be used for surface pads 55 to improve electrical contact.

While the test adaptor board mounted as shown in FIG. 6 is useful, the inventors realize that the distance from test socket 51 to motherboard substrate 30 can be reduced further. Such a reduction in spacing reduces loading by pins 52, improving the speed that memory module 18 can be tested at. Also, connector 53 can limit the spacing, and it adds capacitance, increasing delays. Standoff 62 must be sufficiently long to keep metal plate 64 from touching the solder or any protruding posts and pins on the solder side of motherboard substrate 30. Further, fixed-size standoffs are sometimes used that are larger than necessary.

The inventors have realized that the spacing can be reduced by forming a depression or well in metal plate 64. The test adaptor board is fitted into the well, allowing a closer spacing of the test adaptor board to the motherboard, while still using a standard standoff, keeping the metal plate sufficiently far from the motherboard.

Figure 7A:
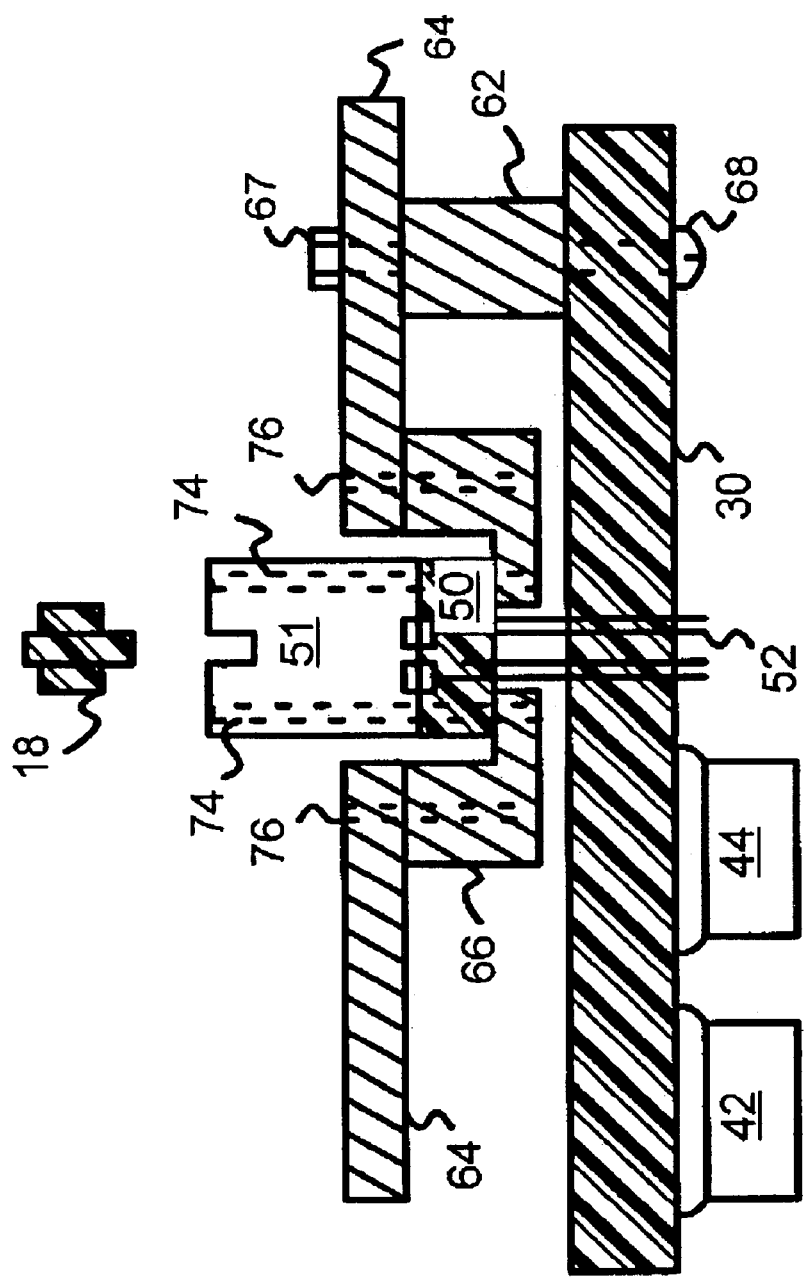
FIG. 7A is a cross-sectional diagram of a test adaptor board mounted in a well in the metal plate, allowing for a closer spacing to the motherboard.

Test Adaptor Board in Well—FIG. 7A

FIG. 7A is a cross-sectional diagram of a test adaptor board mounted in a well in the metal plate, allowing for a closer spacing to the motherboard. Ideally, a smaller test adaptor board 50 is used, perhaps being small enough to fit underneath test socket 51 with little or no overhang as shown. Additional metal wiring layers can be used for the PCB of test adaptor board 50 to permit a smaller area board while still providing the necessary wiring. Of course, a larger test adaptor board may be substituted, as long as it still fits within well 66.

Test adaptor board 50 is mounted on well 66, which can be a metal depression that is bolted to the bottom of metal plate 64 by bolts 76. Test socket 51 is bolted to well 66 rather than to metal plate 64 using bolts 74. Since well 66 fits below metal plate 64, the spacing of test adaptor board 50 to motherboard substrate 30 is reduced. Well 66 can be made deep to permit a closer mounting of test adaptor board 50 while still having a large spacing for metal plate 64 provided by standoff 62.

Well 66 can be constructed from a variety of materials, such as metal, composites, or even plastics. The small size of well 66 compared to the size of metal plate 64 allows more flexibility in the well material, since thermal expansion occurs over a smaller area. For typical motherboards, the area of motherboard substrate 30 is much larger than well 66. From the top, well 66 appears as an elongated rectangle slightly larger on all sides than test socket 51, being roughly 1 by 3 inches. In contrast, motherboard substrate 30 and metal plate 64 are much larger, perhaps 6 by 8 inches.

Some components, such as resistors or capacitors, may even be attached to the solder side of motherboard substrate 30. The larger spacing of metal plate 64 permits such solder-side components, as long as the area under well 66 with the reduced spacing is free of such components.

Memory module 18, the module to be tested, is inserted into test socket 51 manually or by a robotic arm or other automatic device. Test socket 51 is a production-quality test socket requiring a low or zero insertion force and is able to accept many insertions, such as 100,000 or more insertions before the socket fails. Test socket 51 uses surface-mount technology in this embodiment, although traditional pins or other technologies such as ball-grid arrays could be substituted.

The metal leads or pads on the edge connector of memory module 18 make contact with mating pads in the slot on top of test socket 51. Test socket 51 contains internal wiring to connect the power, ground, address, data, and control signals from memory module 18 to surface pads 55 on the bottom of test socket 51. Surface pads 55 make electrical connections with matching pads on the top surface of the substrate of test adaptor board 50. This substrate is typically epoxy-glass or fiberglass, usually with multiple metal layers for wiring, such as with a typical printed-circuit board (PCB). For example, a PCB with 6 wiring layers can be used.

The matching pads on the top of substrate for test adaptor board 50 are connected by the wiring layers and vias of test adaptor board 50 directly to pins 52, which are inserted into vias in test adaptor board 50. Pins 52 may be soldered or pressure-gripped to vias in test adapter board 50. An annular disk or ring can be formed near the top of each pin 52 to hold the pin to the test adapter board. Pins 52 are soldered into holes in motherboard substrate 30. These holes are where a memory-module socket was removed from the front or component-side surface of motherboard substrate 30. Components 42, 44 and many other components (not shown) are mounted to the component side of motherboard substrate 30. Thus electrical connection is made with the motherboard's DRAM memory bus to memory module 18 inserted into test socket 51.

Metal plate 64 with well 66 rigidly support test adaptor board 50. Metal plate 64 is held to motherboard substrate 30 by standoff 62. Standoff 62 is a metal cylinder that has bolt 68 passing through its center. Bolt 68 passes through a hole in motherboard substrate 30, through standoff 62, and metal plate 64, and is held in place by nut 67. The hole through metal plate 64 may also be threaded, eliminating the need for nut 67.

Test adaptor board 50 is mounted to well 66 by screws or bolts 74. Bolts 74 pass through holes in test socket 51, and holes in the substrate of test adaptor board 50 and well 66. The holes in well 66 can be threaded, or nuts can be used. Bolts 74 rigidly clamp test socket 51 to test adaptor board 50 and also clamp test adaptor board 50 to well 66. The pressure exerted by bolts 74 is sufficient to press surface pads 55 to mating metal pads on the top surface of test adaptor board 50 so that good electrical contact is made. A malleable metal can be used for surface pads 55 to improve electrical contact.

Figure 7B:
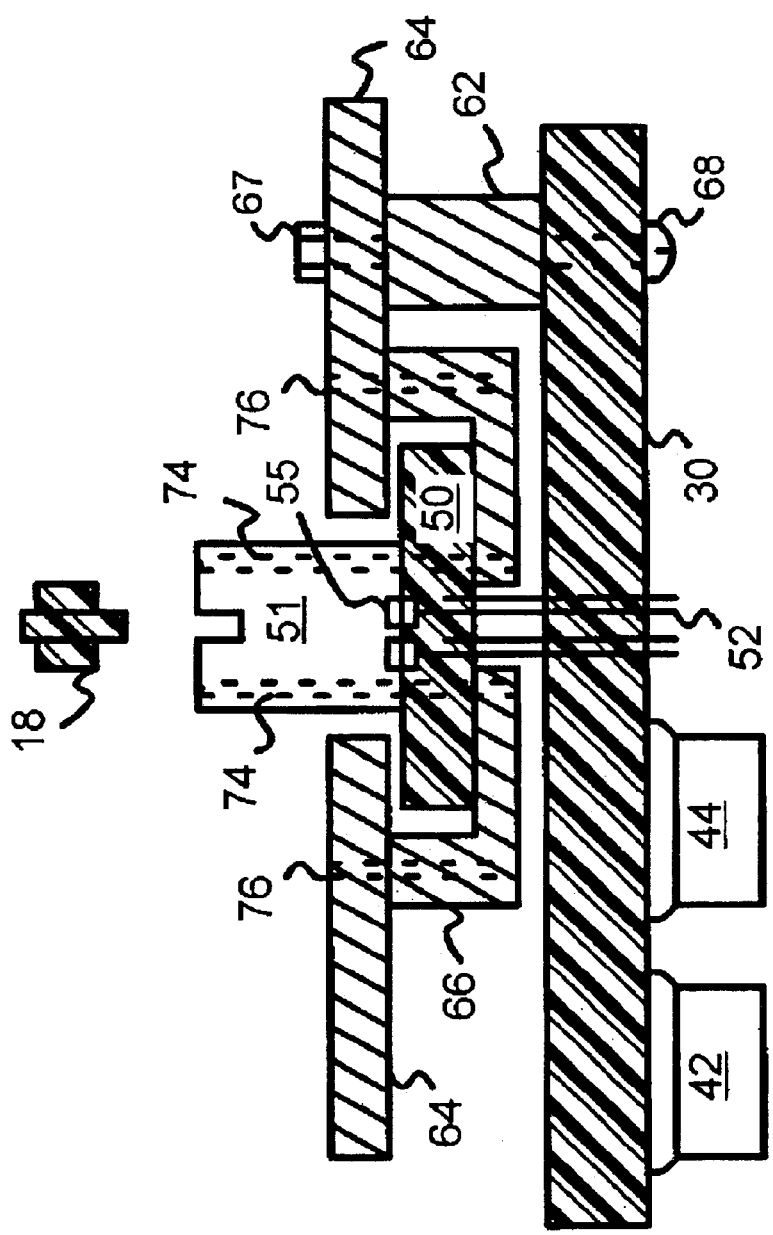
FIG. 7B is a cross-sectional diagram of a larger test adaptor board mounted in a well in the metal plate, allowing for a closer spacing to the motherboard.

Test Adaptor Board in Larger Well—FIG. 7B

FIG. 7B is a cross-sectional diagram of a larger test adaptor board mounted in a well in the metal plate, allowing for a closer spacing to the motherboard. In this alternate embodiment, test adaptor board 50 is somewhat larger in area, so that it protrudes beyond test socket 51. Well 66 is larger in area to accommodate the larger test adaptor board 50. Metal plate 64 is bolted to well 66 by bolts 76 as described before, while test socket 51 is surface-mounted to test adaptor board 50 by bolts 74, which also mount test adaptor board 50 to well 66. Surface pads 55 make electrical contact with metal wiring on test adaptor board 50, while pins 52 are either pressed or soldered into holes in test adaptor board 50 and into holes in motherboard substrate 30.

Metal plate 64 overhangs above test adaptor board 50 in this embodiment, providing further mechanical stability due to the sandwiching of the test adapter board between metal plate 64 and well 66. The test adapter board is slightly taller than the well depression. Alternately, the overhang could be reduced or eliminated by forming a larger opening in metal plate 64. This allows the placement of circuitry on top of the test adapter board, for example, to control the supply voltage or condition the signals to the module-under-test 18. The opening in metal plate 64 is large enough to permit inserting memory module 18 into the slot in test socket 51.

Standoff 62 provides a sufficiently large spacing to motherboard substrate 30 from metal plate 64 so that any solder-side-mounted components or wires do not short to metal plate 64, even when thermal expansion or vibration occurs. Most of the major components 42, 44 are mounted to the component side of motherboard substrate 30. Bolt 68 passes through a hole in motherboard substrate 30, through standoff 62, and metal plate 64, and is held in place by nut 67. Additional standoffs (not shown) are often present, such as one standoff in each of four corners of motherboard substrate 30.

This embodiment has the advantage of a possibly thinner test adaptor board 50, since more area is available for routing signals from test socket 51 to pins 52. The additional area may allow for fewer metal wiring and insulating layers in the PCB of test adaptor board 50, thus reducing its thickness. The thinner test adaptor board 50 allows for a closer spacing of test socket 51 to motherboard substrate 30, thus reducing signal delays and improving test speed.

Figure 7C:
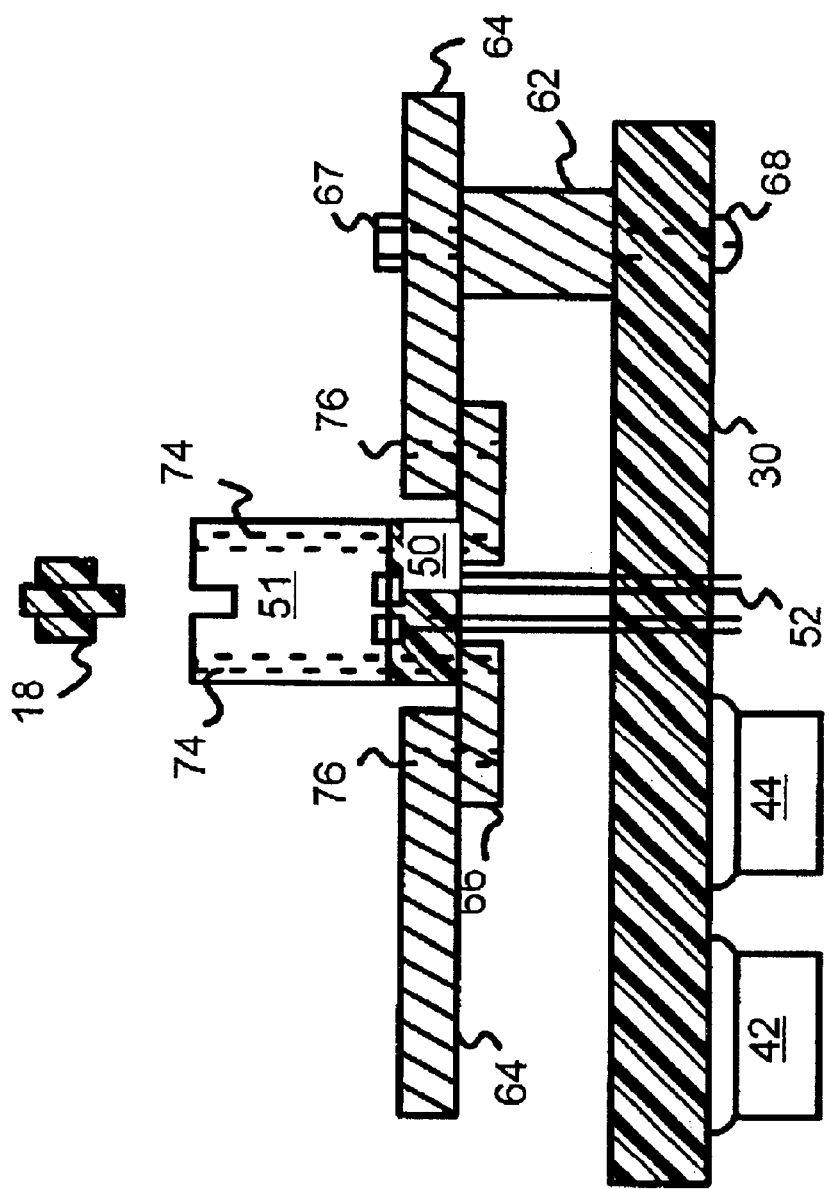
FIG. 7C is a cross-sectional diagram of a test adaptor board mounted in a shallow well on the metal plate.

Test Adaptor Board in Shallow Well—FIG. 7C

FIG. 7C is a cross-sectional diagram of a test adaptor board mounted in a shallow well on the metal plate. In this alternate embodiment, test adaptor board 50 is reduced in area, as described for FIG. 7A, so that it protrudes very little beyond test socket 51.

In this embodiment, well 66 is much shallower, being simply another metal plate that is mounted below metal plate 64. Metal plate 64 is bolted to well 66 by bolts 76 as described before, while test socket 51 is surface-mounted to test adaptor board 50 by bolts 74, which also mount test adaptor board 50 to well 66. Surface pads 55 make electrical contact with metal wiring on test adaptor board 50, while pins 52 are either pressed or soldered into holes in test adaptor board 50 and into holes in motherboard substrate 30. Bolt 68 passes through a hole in motherboard substrate 30, through standoff 62, and metal plate 64, and is held in place by nut 67.

Since well 66 is just a flat metal plate in this embodiment, test adaptor board 50 is mounted at the same level as metal plate 64. The spacing from test adaptor board 50 to motherboard substrate 30 is reduced by the thickness of metal plate 64. The spacing is larger than for the embodiments of FIGS. 7A, 7B, since the well has a larger depression formed in it for those embodiments. The advantage of well 66 in FIG. 7C is the simpler construction of well 66.

Figure 8:
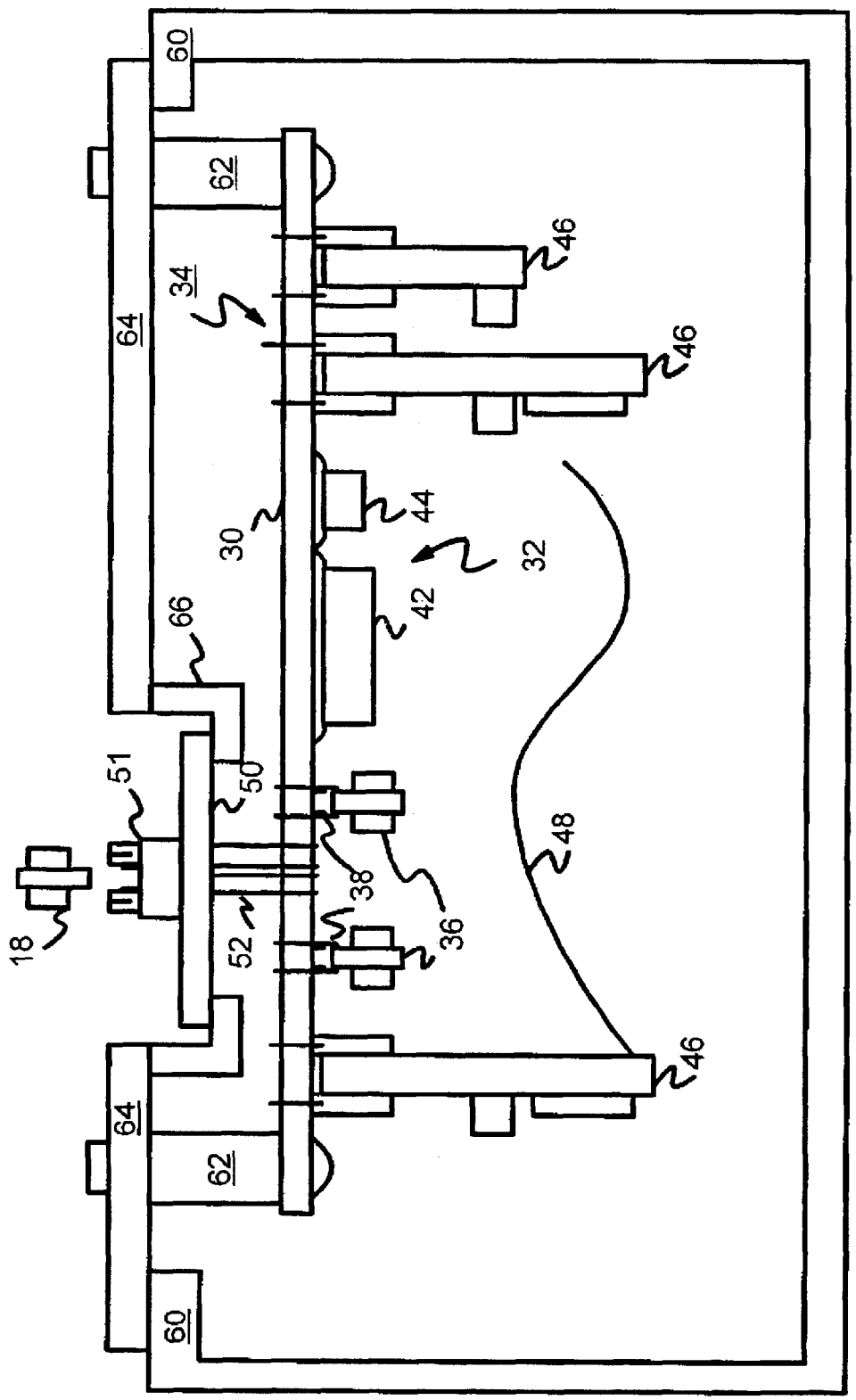
FIG. 8 illustrates the test adapter board and motherboard mounted to a removable metal plate.

Motherboard Mounted to Metal Plate for Quick Removal—FIG. 8

FIG. 8 illustrates the test adapter board and motherboard mounted to a removable metal plate. A conventional PC motherboard is mounted upside-down within chassis 60. Rather than connect motherboard substrate 30 directly to chassis 60, as in a conventional PC, motherboard substrate 30 is mounted to metal plate 64 by standoffs 62. Motherboard substrate 30 is not mounted directly to chassis 60 in this embodiment, although it could be in some embodiments.

Test adapter board 50 is mounted to well 66, while well 66 is mounted to metal plate 64. Test socket 51 is mounted to test adapter board 50, while pins 52 provide electrical connection from test socket 51 to motherboard substrate 30. The memory module 18 being tested is inserted into test socket 51.

Motherboard substrate 30 together with test adapter board 50 can be quickly removed from chassis 60 by lifting metal plate 64 up and out of chassis 60. Screws, bolts, or clamps (not shown) can be used to secure metal plate 64 to chassis 60. These screws can be quickly removed by a technician when the motherboard/test board assembly needs to be replaced. This allows the tester to continue operating with a replacement motherboard/test adapter board assembly with minimum downtime. Metal plate 64 normally has a larger area than does motherboard substrate 30 so that metal plate 64 has an overhang that can be used to mount it to chassis 60.

Motherboard substrate 30 has components 42, 44 mounted on component-side 32 of substrate 30. Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for SIMM sockets 38. One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32.

Test adaptor board 50 provides electrical connection from the module-under-test (MUT) in the SIMM/DIMM test socket 51 to the leads for the removed SIMM socket on the PC motherboard. Test adaptor board 50 provides a slight spacing or offset from the solder-side 34 surface of substrate 30, allowing a robotic arm to easily reach test socket 51 and plug memory module 18 under test directly into test socket 51 on adaptor board 50.

Since the offset of adaptor board 50 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 and the use of well 66 allow for close mounting of SIMM/DIMM test socket 51 to the PC motherboard.

Figure 9:
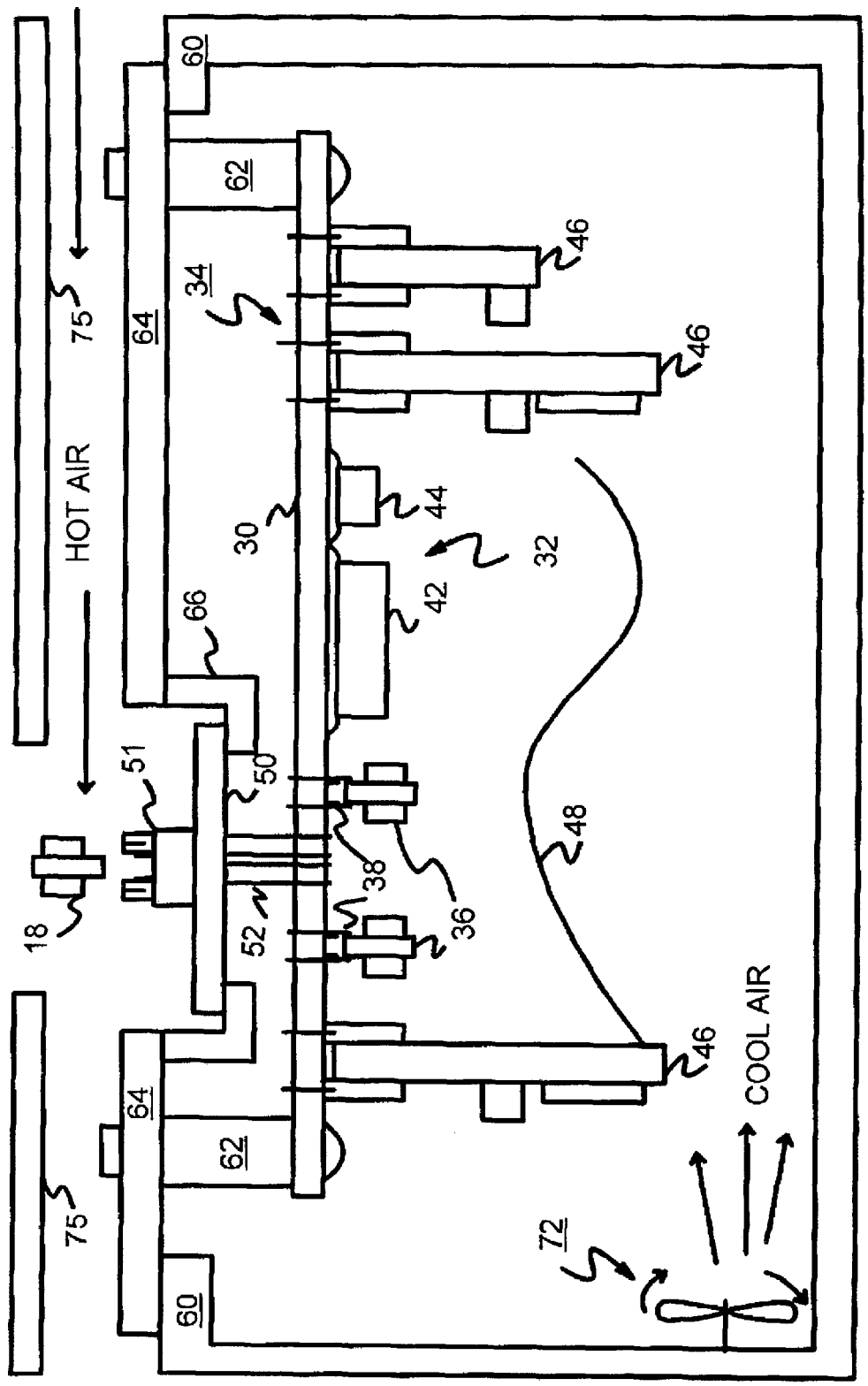
FIG. 9 highlights using a top plate to funnel hot air to the memory module being tested, while the motherboard inside the chassis is cooled.

Heating of Tested Module, but Cooling of Motherboard—FIG. 9

FIG. 9 highlights using a top plate to funnel hot air to the memory module being tested, while the motherboard inside the chassis is cooled. The apparatus described for FIG. 8 is used, with the addition of top plate 75. Top plate 75 can be mounted to chassis 60 in a variety of ways, such as by standoffs or metal guides or brackets. Top plate 75 has an opening to allow access to test socket 51 so that a robotic arm can insert and remove memory module 18 from test socket 51.

When environmental testing is desired, heated air is forced between top plate 75 and metal plate 64. This heated air blows past memory module 18 when it is inserted into test socket 51. The heated air warms memory module 18 to an elevated temperature. When memory module 18 is heated, it is typically more likely to fail than when at room temperature. Such elevated-temperature testing provides a margin or guard-band to the test, so that the passing memory modules are more reliable than modules tested at room temperature.

Cooling fan 72 is provided in chassis 60 to cool motherboard substrate 30 and its components 42, 44 and expansion cards 46. Even air at room temperature can be effective at cooling the motherboard if a sufficient volume of air is blown past the motherboard's components. Components such as integrated circuits heat up during operation and benefit from such cooling. Of course, reduced-temperature air could also be blown into chassis 60, such as air from outside a building in a cold climate.

Since metal plate 64 separates motherboard substrate 30 from test adapter board 50, the cooling air from cooling fan 72 is separated from the heated air blown against memory module 18 under test. Test adapter board 50 is mounted within well 66 and forms a sufficient seal to prevent the cooling air within chassis 60 from cooling memory module 18 being heated and tested. The cooling air within chassis 60 is thus prevented by metal plate 64, well 66, and test adapter board 50 from mixing with the heated air blown between metal plate 64 and top plate 75.

Metal plate 64 may conduct some heat, but such heat conduction can be reduced by providing an insulating film on metal plate 64, or by using a less-conductive material such as a composite or plastic for plate 64. Top plate 75 can be replaced with a tube, rectangular pipe, or air guide that blows hot air directly on memory module 18. This may provide a more efficient air flow. Temperature sensors such as thermocouples could be added near the test socket.

Chassis 60 can be provided with slots, holes and openings to allow for air flow to motherboard components 42, 44 and expansion cards 46. Multiple cooling fans can be used. A larger chassis with multiple openings on the top, each for holding a metal plate 64 with a motherboard and test adapter board can be used. This allows for parallel testing using several motherboards and test sockets.

Of course, cold air rather than hot air could be blown onto the memory module by the channel between the top plate and the metal plate. This might be useful for characterizing modules rather than for guard-band testing. Humid hot air could be used for testing hermetic seals of memory chips on the memory module, and even hot and cold air cycling could be done for reliability testing. The air may be recycled and re-blown through the channel by a blower or other air-flow system.

Advantages of Various Embodiments

While the invention described in the parent application has been quite effective, further improvements are disclosed. Of course, not all advantages apply to all embodiments of the invention, and the magnitude of the advantages can also vary with the embodiments. The upside-down motherboard mounting allows cables and expansion boards to be hidden away from the test socket, easing module insertion and removal during testing. The metal plate allows easy removal and replacement of the motherboard and test adapter board, minimizing downtime. Worn test sockets can be replaced by unscrewing the mounting bolts.

Since common PC motherboards form the basis of the test system, a low-cost test apparatus is obtained for testing memory modules. Testing costs are reduced by eliminating expensive electronic testers.

Since the modules under test are connected to the PC motherboard without a long cable, loading on the PC's memory bus is minimized, allowing full-speed testing. Higher-speed memories can then be tested. The low profile of the test adapter card to the motherboard allows the module under test to be placed close to the motherboard. Mounting the test adapter board within a well below the metal plate further reduces spacing to the motherboard and thus further reduces loading.

The relatively flat surface of the solder-side of the PC motherboard allows easy, unobstructed access to the test socket. Removing one or more of the SIMM sockets on the motherboard provides mounting holes for the tester adaptor board, eliminating the need to drill more mounting holes into the PC motherboard substrate. Removing SIMM sockets also reduces capacitive loading on the PC's memory bus.

Some of the SIMM sockets may be left intact on the PC motherboard, allowing memory modules to remain plugged into the PC. These remaining memory modules form a base memory that is used to boot the PC. Thus the PC motherboard can be booted up even when a bad memory module is being tested. This allows for quick error detection and recovery, even when the module under test is faulty.

Testing at elevated temperatures is facilitated, since the metal plate separates the test socket from the motherboard. The motherboard can be cooled while the memory module being tested is heated. This prevents high-temperature failures of motherboard components from occurring. Only the memory module being tested is heated, isolating the heated components from the cooled components of the system.

Alternate Embodiments

Several other embodiments are contemplated by the inventors. For example, many kinds of memory modules can be tested. Modules using standard DRAM or newer EDO and synchronous DRAM can be tested. The system is ideally suited for testing the highest-speed memory modules, since capacitive loading is minimized. Other memories such as RAMBUS modules, DDR modules, and PC133 synchronous modules can be tested.

Various sizes of memory in the memory module, and form factors for memory modules can be used with the invention, limited by the test adaptor board and well size. Different kinds of test adaptor boards can be substituted. The reverse-mounting of the test adaptor boards and the solder-side up arrangement of the test station allows a technician or operator to easily replace the test adaptor boards when necessary. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

The standoff may be constructed from any of a multitude of materials, such as different kinds or alloys of metals, plastic or composite materials. Likewise, the metal plates can be replaced with other materials such as sturdy plastics or composites with sufficient rigidity. Standoffs that are integrated with the bolt can be used. A one-piece plate can be substituted that has the depression or well formed in it to allow close mounting of the test adaptor board to the motherboard. Electrically insulating material may be inserted between the well and the motherboard, permitting an even closer spacing.

The test adaptor board may be mounted to the well by clamps or by snapping into a clamp portion of the well. The test adaptor board could also be bolted to the bottom surface of the well rather than to an upwardly-facing surface of the well. The pins connecting the test adaptor board to the motherboard could take on a variety of shapes and forms, and could even have a ball shape for very close spacings to the motherboard. The pins could be replaced by surface-mounting of the test adaptor board to the motherboard if test adapter board is mounted to bottom of well. A cable or wires could also be used in place of the pins. The surface pads of the test socket can be angled so that there is a spring-like action when mated with the pads on the test adapter board. Pins from the test adapter board that plug into the motherboard can have a ring (outward-going notch and joined to the pin) which prevents it from going beyond the top surface of the test adapter board.

In another alternate embodiment, small cups or pin receptacles are inserted into the holes on the motherboard where the DRAM socket was removed. The pins from the test adapter board plug into these receptacles. In that embodiment, the pins are not soldered directly onto the motherboard. This allows for easy replacement of the motherboard or test adapter board.

The test assembly can be flipped, rotated, turned or otherwise changed in orientation so that the test socket faces to the side or downwardly. The invention can operate in a variety of such orientations, and the description has used an upward orientation for convenience and clarity. When the orientation is altered interpretations of spatial descriptions such as "above" and "below" can be adjusted accordingly.

Multiple test assemblies can be mounted on a bigger chassis with multiple cavities.

The abstract of the disclosure is provided to comply with the rules requiring an abstract which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b).

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A test system for testing memory modules comprising:
   a motherboard, the motherboard being a main board for a computer using memory modules as a memory, the motherboard having a component side and a solder side, the component side having integrated circuits mounted thereon and expansion sockets for expansion boards;
   a supporting plate, mounted to the motherboard above the solder side of the motherboard, the supporting plate having an opening above a memory portion of the motherboard;
   a well, attached to the supporting plate at the opening, the well having a smaller spacing to the solder side of the motherboard than a spacing of the supporting plate to the solder side of the motherboard; and
   a test adaptor board, mounted to the well, the test adaptor board having a test socket for receiving memory modules for testing by the motherboard, the test adaptor board for electrically connecting a memory module inserted into the test socket to the motherboard attached to the test adaptor board, the motherboard using the memory module inserted into the test socket as a portion of the memory of the motherboard,
   whereby the well reduces a spacing of the test adaptor board to the motherboard.

2. The test system of claim 1 further comprising:
   pins, connected between the test adaptor board and the motherboard, for electrically connecting the test adaptor board to the motherboard.

3. The test system of claim 2 wherein the pins are soldered to or pressure-gripped to the test adaptor board and are soldered to holes in the motherboard or are inserted into pin receptacles that have been inserted into the holes, the holes for connecting to a missing socket;
   wherein the opening in the supporting plate is above a location of the missing socket on the motherboard, the missing socket being a type for holding a memory module, the missing socket being within the memory portion of the motherboard;
   wherein the memory portion of the motherboard contains other sockets for holding memory modules,
   whereby the test adaptor board is mounted above the memory portion of the motherboard.

4. The test system of claim 2 wherein the test adaptor board has both a top and a bottom surface that are between the supporting plate and the solder side of the motherboard,
   whereby the test adaptor board is completely below the supporting plate.

5. The test system of claim 2 further comprising:
   a standoff, between the motherboard and the supporting plate, the standoff determining a spacing of the supporting plate to the motherboard;
   whereby the well provides a reduced spacing to the motherboard for the test adaptor board than a spacing of the supporting plate to the motherboard which is determined by the standoff.

6. The test system of claim 2 wherein the supporting plate has an area greater than an area of the motherboard.

7. The test system of claim 6 further comprising:
   a chassis, having a top opening with a open area larger than the area of the motherboard, the supporting plate being mounted to the chassis at the top opening;
   wherein the motherboard is located within the chassis below the supporting plate, the motherboard not being directly mounted to the chassis;
   wherein the test socket is freely accessible from the opening in the supporting plate, whereby the motherboard is mounted to the supporting plate which is mounted to the chassis.

8. The test system of claim 7 wherein the chassis at least partially encloses the motherboard.

9. The test system of claim 8 wherein cooling air is blown onto the motherboard enclosed by the chassis, wherein the cooling air is blocked from blowing onto a memory module inserted into the test socket for testing by the supporting plate, well, and test adaptor board,
   whereby the cooling air cools the motherboard but does not directly cool the memory module being tested in the test socket.

10. The test system of claim 9 further comprising:
    an air guide, situated above the supporting plate, for directing hot air onto the memory module being tested in the test socket,
    whereby the memory module being tested is heated by the hot air while the motherboard is cooled by the cooling air in the chassis.

11. The test system of claim 10 wherein the air guide is a top plate situated above the supporting plate, wherein the hot air is blown between the top plate and the supporting plate.

12. The test system of claim 11 wherein the top plate contains an opening above the test socket to provide access to insert and remove a memory module in the test socket.

13. The test system of claim 7 wherein the supporting plate is made from a metal plate, and wherein the test adaptor board is a multi-layer printed-circuit board (PCB).

14. The test system of claim 13 wherein the test adaptor board has an area substantially the same as an area under the test socket.

15. The test system of claim 13 wherein the test socket is surface-mounted to the test adaptor board using surface pads.

16. The test system of claim 15 wherein the test socket contains bolts that apply pressure to the surface pads.

17. A motherboard-based memory-module tester comprising:
    a motherboard having components including a processor for executing a test program and a local memory and expansion sockets for expansion cards, the components being mounted on a component side of the motherboard opposite a solder side of the motherboard;
    a plate spaced above the solder side of the motherboard;
    a standoff between the plate and the motherboard, for determining a first spacing;

a well within an opening in the plate, the well having a second spacing to the motherboard, the second spacing being smaller than the first spacing;

a test adaptor board, mounted to the well and electrically coupled to the local memory on the motherboard by pins;

a test socket, mounted to the test adaptor board, for receiving a memory module for testing by the motherboard, the test socket being mounted to the test adaptor board by bolts that apply pressure between surface pads on the test socket and surface pads on the test adaptor board to make electrical contact; and a chassis for enclosing the motherboard and expansion cards for the motherboard, the chassis providing cooling air for cooling the motherboard;

wherein the plate is mounted to the chassis while the motherboard is not directly mounted to the chassis except through the plate, whereby spacing for the test adaptor board to the motherboard is reduced.

18. The motherboard-based memory-module tester of claim 17 further comprising:

a hot air channel for blowing hot air onto the memory module inserted into the test socket, whereby the memory module is heated while the motherboard is cooled.

19. The motherboard-based memory-module tester of claim 17 wherein the motherboard is a personal computer PC main board.

20. A motherboard-based memory tester comprising:

motherboard means, having a component side with components and a solder side being relatively free of components, for executing a test program on a memory module being tested;

test socket means for receiving the memory module for testing;

test adaptor board means, having the test socket means mounted thereon, for electrically connecting the test socket means to a memory bus means on the motherboard means;

wherein the solder side of the motherboard means faces the test adaptor board means while the component side faces away from the test adaptor board means;

supporting means, for supporting the test adaptor board means and the motherboard means, the supporting means having an opening to allow insertion of the memory module into the test socket means;

spacing means, coupled between the supporting means and the motherboard means, to provide a spacing between the motherboard means and the supporting means; and spacing-reducing means, attached to the supporting means and to the test adaptor board means, for reducing a spacing from the test adaptor board means to the motherboard means, wherein the test adaptor board means has a closer spacing to the motherboard than the supporting means at the opening, whereby spacing from the test adaptor board means to the motherboard means is reduced.

21. The motherboard-based memory tester of claim 20 further comprising:

chassis means for enclosing the motherboard means and any expansion cards plugged into expansion slots on the motherboard means, wherein the supporting means is mounted to the chassis means while the motherboard means and the test adaptor board means are not directly mounted to the chassis means except through the supporting means;

cooling means, coupled to the chassis means, for cooling the motherboard means; and heating means, coupled to blow hot air onto the memory module inserted into the test socket means during testing, for elevating a temperature of the memory module being tested while the motherboard means is cooled, whereby separate heating of the memory module and cooling of the motherboard means is performed.

* * * * *